United States Patent
Ryou

(10) Patent No.: US 9,301,387 B2
(45) Date of Patent: Mar. 29, 2016

(54) PRINTED CIRCUIT BOARD WITH BURR PREVENTION STRUCTURE

(71) Applicant: LG INNOTEK CO., LTD., Seoul (KR)

(72) Inventor: Chung Sang Ryou, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 379 days.

(21) Appl. No.: 13/774,655

(22) Filed: Feb. 22, 2013

(65) Prior Publication Data

US 2013/0229778 A1 Sep. 5, 2013

(30) Foreign Application Priority Data

Mar. 2, 2012 (KR) ........................ 10-2012-0021742

(51) Int. Cl.
*H05K 1/11* (2006.01)
*H05K 1/14* (2006.01)
*H05K 1/02* (2006.01)
*H05K 3/00* (2006.01)

(52) U.S. Cl.
CPC ............... *H05K 1/0266* (2013.01); *H05K 1/02* (2013.01); *H05K 3/0052* (2013.01); *H05K 1/0269* (2013.01); *H05K 3/0008* (2013.01); *H05K 2201/0909* (2013.01); *H05K 2201/09063* (2013.01); *H05K 2201/09918* (2013.01); *Y10T 29/49117* (2015.01)

(58) Field of Classification Search
USPC ........................... 174/258–262; 361/760–764
See application file for complete search history.

(56) References Cited

U.S. PATENT DOCUMENTS

| | | | |
|---|---|---|---|
| 5,786,266 A * | 7/1998 | Boruta .......................... 438/462 |
| 6,239,380 B1 * | 5/2001 | Drussel ................. H01L 21/481 174/250 |
| 6,281,047 B1 * | 8/2001 | Wu et al. ....................... 438/113 |
| 6,287,895 B1 * | 9/2001 | Sato .............................. 438/114 |
| 6,358,776 B1 * | 3/2002 | Takehara et al. .............. 438/113 |
| 6,444,499 B1 * | 9/2002 | Swiss .................... H01L 21/481 257/E23.004 |
| 6,580,620 B1 * | 6/2003 | Kim .............................. 361/784 |
| 6,723,583 B2 * | 4/2004 | Takahashi et al. ............ 438/114 |
| 2005/0051881 A1 * | 3/2005 | Chen et al. .................... 257/678 |

* cited by examiner

*Primary Examiner* — Tuan T Dinh
(74) *Attorney, Agent, or Firm* — Birch, Stewart, Kolasch & Birch, LLP

(57) ABSTRACT

A PCB according to an exemplary embodiment of the present disclosure includes a plurality of unit PCBs arrayed on the PCB, and a sawing line formed among the plurality of unit PCBs. The sawing line disposed among the dummy unit PCBs is formed with a conductive pad including a first layer formed with a PSR (Photo Solder Resistor) and a second layer on which the PSR is removed to open the conductive pad. Burr generation on the unit PCBs during a sawing process is prevented and a dummy area can be reduced.

6 Claims, 5 Drawing Sheets

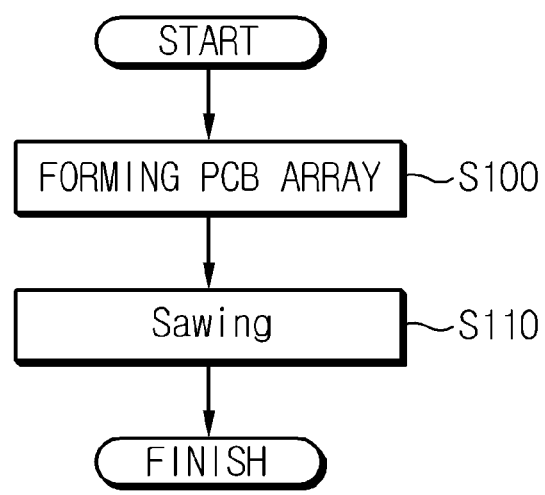

PRINTED CIRCUIT BOARD WITH BURR PREVENTION STRUCTURE

Pursuant to 35 U.S.C. §119 (a), this application claims the benefit of earlier filing date and right of priority to Korean Patent Application No. 10-2012-0021742, filed on Mar. 2, 2012, the contents of which are hereby incorporated by reference in their entirety.

BACKGROUND OF THE DISCLOSURE

1. Field of the Invention

The present disclosure relates to a printed circuit board and a method for manufacturing the same.

2. Discussion of the Related Art

This section provides background information related to the present disclosure which is not necessarily prior art.

A PCB, obtained by printing a circuit line pattern on an electrically insulating substrate using a conductive material such as copper, refers to a board before electronic components are mounted thereon. That is, the PCB is a circuit board that defines mounting positions of various electronic components and fixes a line pattern, printed thereon, for connecting the components such that the various electronic components are mounted on the board.

Concomitant with development of semiconductors and electronic appliances, the PCB has recently taken up a firm position as one of electronic components and widely used as a component realizing a circuit for all electric and electronic devices from various electric and electronic products such as televisions and portable terminals to computers and cutting-edge electronic devices.

Thus, technical development and researches to the PCB are being waged even today from various angles to make characteristics and reliability of PCB more advanced and excellent.

SUMMARY OF THE DISCLOSURE

This section provides a general summary of the disclosure, and is not a comprehensive disclosure of its full scope or all of its features.

Exemplary embodiments of the present disclosure provide to solve a technical subject configured to reduce a dummy area by minimizing an area among unit PCBs.

It should be emphasized, however, that the present disclosure is not limited to a particular disclosure, as explained above. It should be understood that other technical subjects not mentioned herein may be appreciated by those skilled in the art.

In one general aspect of the present disclosure, there is provided a PCB, the PCB comprising: a plurality of unit PCBs arrayed on the PCB; and a sawing line formed among the plurality of unit PCBs.

Preferably, but not necessarily, each of the unit PCBs may be an embedded PCB embedded with any one of an active element, a passive element, and the active element and the passive element.

Preferably, but not necessarily, each of the unit PCBs may be a single layer PCB or a multilayer (build-up) PCB.

Preferably, but not necessarily, the sawing line may be formed with an ID (Identification) mark for sawing process.

Preferably, but not necessarily, a periphery of the arrayed plurality of unit PCBs may be arranged with dummy unit PCBs.

Preferably, but not necessarily, a sawing line may be formed among the dummy unit PCBs.

Preferably, but not necessarily, the sawing line among the dummy unit PCBs may be formed with a conductive pad, the conductive pad may be formed with a PSR (Photo Solder Resistor) layer, and a predetermined area of the sawing line among the dummy unit PCBs may be removed of the PSR layer to open the conductive pad.

Preferably, but not necessarily, the conductive pad may be used as an ID mark for sawing line.

Preferably, but not necessarily, a sawing line area at a corner of the arrayed plurality of unit PCBs may be formed with a hole.

Preferably, but not necessarily, width (W) of the sawing line may be less than 300 μm.

Preferably, but not necessarily, the sawing line may be formed with a groove.

Preferably, but not necessarily, the groove may be a V-shaped groove.

Preferably, but not necessarily, a sawing line area at a corner of the arrayed plurality of unit PCBs may be formed with a hole.

In another general aspect of the present disclosure, there is provided a PCB, the PCB comprising: unit PCBs divided by a first sawing line; dummy PCBs divided by a second sawing line connected to the first sawing line, and arranged at a periphery of the unit PCBs; and an ID mark for a sawing process formed at the second sawing line.

Preferably, but not necessarily, the sawing line among the dummy unit PCBs may be formed with a conductive pad, the conductive pad may be formed with a PSR (Photo Solder Resistor) layer, a predetermined area of the sawing line among the dummy unit PCBs may be removed of the PSR layer to open the conductive pad, and the opened conductive pad may be used for an ID mark of the sawing process.

Preferably, but not necessarily, a sawing line area at a corner of the plurality of unit PCBs divided by the first sawing line may be formed with a hole.

Preferably, but not necessarily, the sawing line may be formed with a groove.

Preferably, but not necessarily, the groove may be a V-shaped groove.

Preferably, but not necessarily, the first sawing line may be realized by grooves each formed at an upper surface and a bottom surface of the PCB.

In still another general aspect of the present disclosure, there is provided a method for manufacturing a PCB, the method comprising: forming a PCB arrayed with a plurality of unit PCBs and formed with a sawing line among the plurality of unit PCBs; and separating the plurality of unit PCBs by sawing along the sawing line.

The exemplary embodiments of the present disclosure has an advantageous effect in that an array of unit PCBs is realized by a structure capable of being sawed to minimize an area among the unit PCBs, and to reduce a dummy area, whereby material cost of PCBs can be reduced.

The exemplary embodiments of the present disclosure has another advantageous effect in that separation of unit PCBs by sawing process prevents burrs from being generated on a lateral wall area of the unit PCBs, allowing the unit PCBs to be separated to an initially designed size, whereby size can be uniformly made.

The exemplary embodiments of the present disclosure has still another advantageous effect in that no burrs are generated on the lateral wall area of the unit PCBs to allow size of the unit PCBs to be uniformly made, whereby an active alignment of the unit PCBs can be realized in an automation process The exemplary embodiments of the present disclosure has still further advantageous effect in that, in a case the unit PCBs are used as a base board of a camera module, burrs are not generated on the lateral wall area to make the lateral wall area smooth, whereby generation of foreign objects on the lateral wall area can be reduced to a minimum.

The exemplary embodiments of the present disclosure has still further advantageous effect in that separation of the unit PCBs using a sawing process can increase yield through simplified process.

BRIEF DESCRIPTION OF THE DRAWINGS

In order to explain the principle of the present disclosure, some accompanying drawings related to its preferred embodiments are below reported for the purpose of illustration, exemplification and description, although they are not intended to be exhaustive. The drawing figures depict one or more exemplary embodiments in accord with the present concepts, by way of example only, not by way of limitations. In the figures, like reference numerals refer to the same or similar elements.

Thus, a wide variety of potential practical and useful embodiments will be more readily understood through the following detailed description of certain exemplary embodiments, with reference to the accompanying exemplary drawings in which:

FIG. 7 is a flowchart illustrating a method for manufacturing a PCB according to an exemplary embodiment of the present disclosure.

DETAILED DESCRIPTION

In describing the present disclosure, detailed descriptions of constructions or processes known in the art may be omitted to avoid obscuring appreciation of the invention by a person of ordinary skill in the art with unnecessary detail regarding such known constructions and functions.

Accordingly, the meaning of specific terms or words used in the specification and claims should not be limited to the literal or commonly employed sense, but should be construed or may be different in accordance with the intention of a user or an operator and customary usages. Therefore, the definition of the specific terms or words should be based on the contents across the specification.

Hereinafter, exemplary embodiments of the present disclosure will be described in detail with reference to the accompanying drawings.

Figure 1:
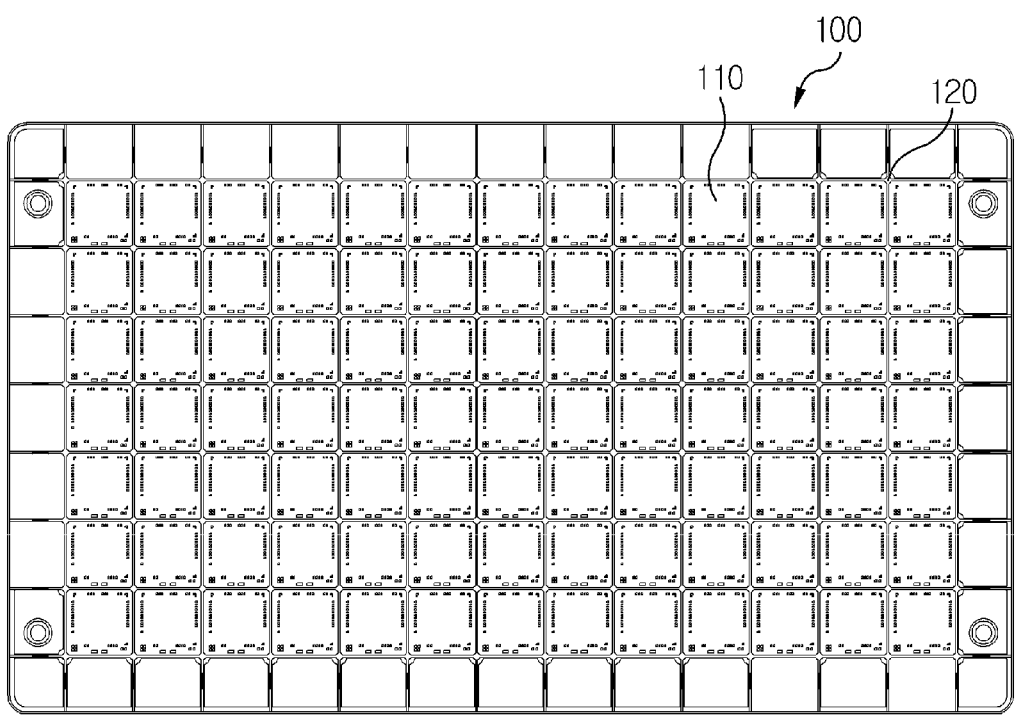
FIG. 1 is a plan view illustrating a PCB according to an exemplary embodiment of the present disclosure.
Figure 2:
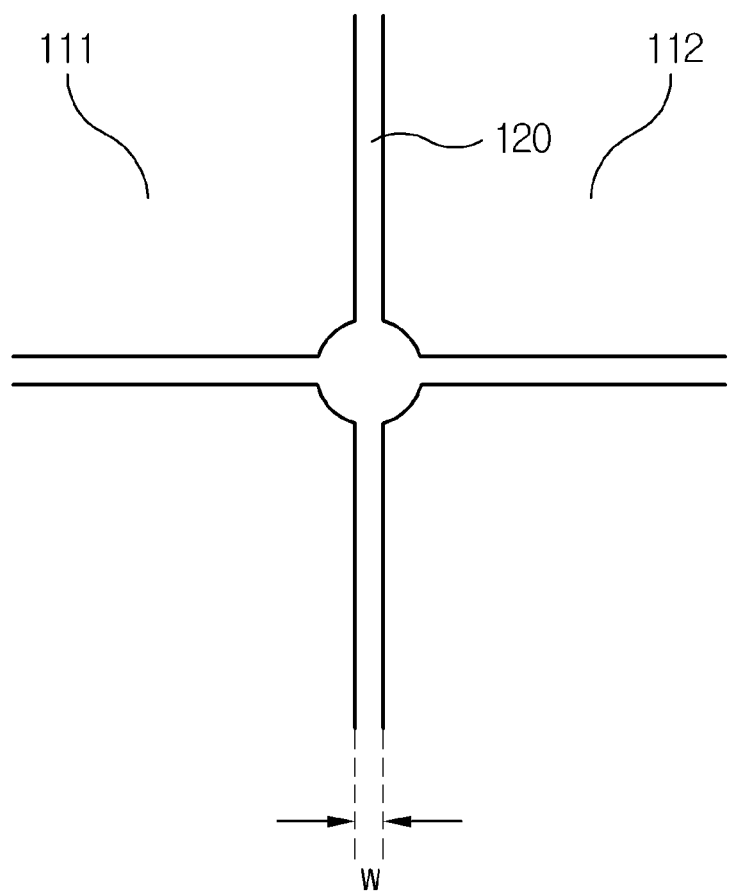
FIG. 2 is a schematic view illustrating a PCB according to an exemplary embodiment of the present disclosure.

FIG. 1 is a plan view illustrating a PCB according to an exemplary embodiment of the present disclosure, and FIG. 2 is a schematic view illustrating a PCB according to an exemplary embodiment of the present disclosure.

Referring to FIGS. 1 and 2, a PCB 100 according to an exemplary embodiment of the present disclosure includes a plurality of unit PCBs 110 that is arrayed on the PCB 100, and a sawing line 120 formed among the plurality of unit PCBs 110. Thus, the plurality of unit PCBs 110 can be separated into pieces, in a case a sawing process is performed along the sawing line 120.

At this time, width (W) of the sawing line 120 may be set at less than 300 μm. Furthermore, each of the unit PCBs may be an embedded PCB embedded with any one of an active element, a passive element, and the active element and the passive element. Thus, an exemplary embodiment of the present disclosure is advantageous in that an array of unit PCBs is realized by a structure capable of being sawed to minimize an area among the unit PCBs, and to reduce a dummy area, whereby material cost of PCBs can be reduced.

Meanwhile, an exemplary embodiment of the present disclosure can realize a PCB in a structure capable of connecting each of the unit PCBs 110 using a bridge, where the bridge may be removed to allow the unit PCBs 110 to be separated to pieces. At this time, the bridge may not be completely removed to generate burrs at a lateral wall area of the bridge-not-removed unit PCB, where the burrs may be a factor causing size of each of the unit PCBs to be uneven.

Thus, as illustrated in FIG. 1, the PCB according to an exemplary embodiment of the present disclosure is advantageous in that the unit PCBs can be separated by a sawing process to prevent burrs from being generated on the lateral wall area of the unit PCBs, allowing the unit PCBs to be separated to an initially designed size, whereby size can be uniformly made.

Furthermore, no burrs are generated on the lateral wall area of the unit PCBs in the PCB according to an exemplary embodiment of the present to allow size of the unit PCB to be uniformly made, whereby an active alignment of the unit PCB can be realized in an automation process The PCB according to an exemplary embodiments of the present disclosure is configured such that, in a case the unit PCBs are used as a base board of a camera module, burrs are not generated on the lateral wall area to make the lateral wall area smooth, whereby generation of foreign objects on the lateral wall area can be reduced to a minimum.

An exemplary embodiment of the present disclosure is such that separation of the unit PCBs using a sawing process can increase yield through simplified process.

At the same time, each of the unit PCBs 110 may be a single layer PCB or a multilayer (build-up) PCB formed in a multi-stacked PCB. Furthermore, the sawing line may be formed with an ID (Identification) mark for sawing process.

Figure 3:
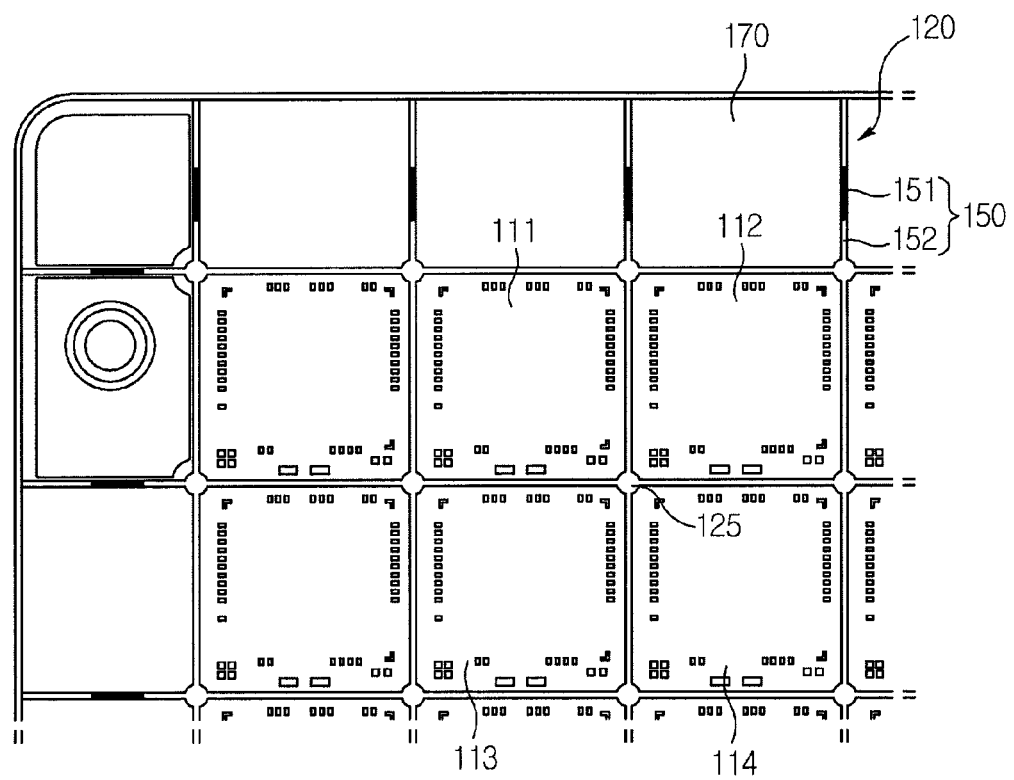
FIG. 3 is a plan view illustrating a structure of a PCB according to an exemplary embodiment of the present disclosure.

FIG. 3 is a plan view illustrating a structure of a PCB according to an exemplary embodiment of the present disclosure.

In the structure of a PCB according to an exemplary embodiment of the present disclosure, as explained above, a sawing line 120 is provided among the arrayed plurality of unit PCBs 111, 112, 113, 114.

In addition, a periphery of the arrayed plurality of unit PCBs 111, 112, 113, 114 is arranged with dummy unit PCBs 170, where the sawing line 120 is also formed among the dummy unit PCBs 170.

Furthermore, the sawing line 120 among the dummy unit PCBs 170 is formed with a conductive pad 150, and the conductive pad 150 includes a layer 151 formed with a PSR (Photo Solder Resistor). At this time a predetermined area 152 of the sawing line 120 among the dummy unit PCBs is removed of the PSR to open the conductive pad 150. Thus, the conductive pad 150 may be used as an ID mark for a coordinate for sawing process.

Still furthermore, a sawing line 120 area at a corner of the arrayed plurality of unit PCBs 111, 112, 113, 114 may be formed with a hole 125. The sawing process is a process of cutting along the saw line 120 using a blade, where the hole prevents the corner of the cut unit PCBs from being sharpened.

Meanwhile, in the exemplary embodiment of the present disclosure, a sawing line dividing the unit PCBs may be defined as a first sawing line and a sawing line dividing the dummy unit PCBs arranged on the periphery of the unit PCB may be defined as a second sawing line, where the first and second sawing lines may be connected, and an ID mark of sawing process may be formed on the second sawing line.

Figure 4:
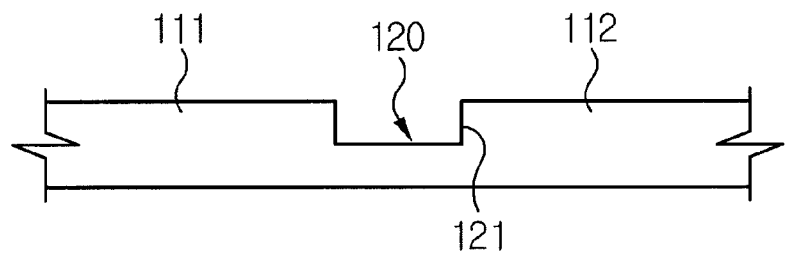
FIG. 4 is a cross-sectional view illustrating an example of a structure of a sawing line of a PCB according to an exemplary embodiment of the present disclosure.
Figure 5:
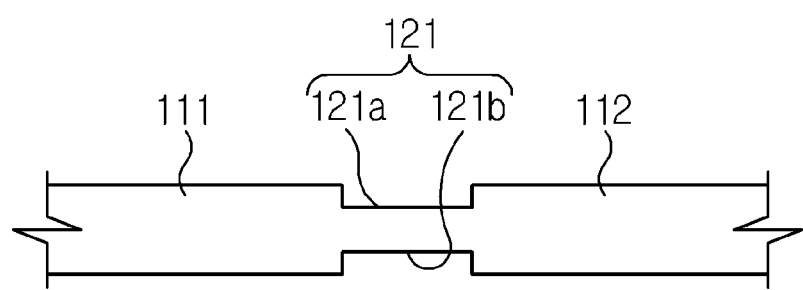
FIG. 5 is a cross-sectional view illustrating another example of a structure of a sawing line of a PCB according to an exemplary embodiment of the present disclosure.
Figure 6:
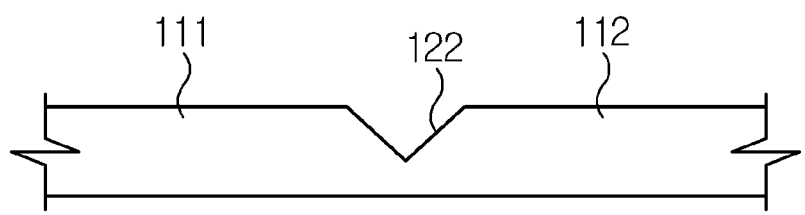
FIG. 6 is a cross-sectional view illustrating still another example of a structure of a sawing line of a PCB according to an exemplary embodiment of the present disclosure.

FIG. 4 is a cross-sectional view illustrating an example of a structure of a sawing line of a PCB according to an exemplary embodiment of the present disclosure, FIG. 5 is a cross-sectional view illustrating another example of a structure of a sawing line of a PCB according to an exemplary embodiment of the present disclosure, and FIG. 6 is a cross-sectional view illustrating still another example of a structure of a sawing line of a PCB according to an exemplary embodiment of the present disclosure.

First, the sawing line 120 is positioned between the unit PCBs 111, 112 to function as a guide during a sawing process. To this end, the sawing line 120 is formed with a groove 121 as shown in FIG. 4, and the groove 121 can clearly divide the unit PCBs 111, 112.

Furthermore, as illustrated in FIG. 5, the sawing line 120 may be realized by grooves 121*a*, 121*b*, each formed at an upper surface and a bottom surface of the PCB. Still furthermore, the groove 121 of the sawing line 120 may be realized by a V-shaped groove as shown in FIG. 6.

FIG. 7 is a flowchart illustrating a method for manufacturing a PCB according to an exemplary embodiment of the present disclosure.

The method for manufacturing a PCB according to an exemplary embodiment of the present disclosure may be such that a PCB is formed that is arrayed with a plurality of unit PCB and formed with a sawing line among the plurality of unit PCBs (S100). Thereafter, the plurality of unit PCBs is separated by sawing along the sawing line (S110).

Although the present disclosure has been described with reference to a number of illustrative embodiments thereof, it should be understood that numerous other modifications and embodiments can be devised by those skilled in the art that will fall within the spirit and scope of the principles of this disclosure.

What is claimed is:

1. A PCB with burr prevention structure, the PCB comprising:
   a plurality of unit PCBs arrayed on the PCB;
   a plurality of dummy PCBs arranged at a periphery of the unit PCBs;
   a first sawing line formed among the plurality of unit PCBs; and
   a second sawing line formed among the plurality of dummy PCBs and connected to the first sawing line,
   wherein the second sawing line is formed with an ID (identification) mark for a sawing process of the PCB,
   wherein the ID mark includes a conductive pad comprising a first layer formed with a Photo Solder Resistor (PSR) and a second layer on which the PSR is removed at a predetermined area to open the conductive pad, and
   wherein the first sawing line is formed at each corner of the plurality of unit PCBs with a hole to inhibit the corner of the unit PCBs from being sharpened;
   wherein the first sawing line includes grooves formed at an upper surface and a bottom surface of the PCB.

2. The PCB of claim 1, wherein each of the first sawing line and the second sawing line is formed with a groove.

3. The PCB of claim 1, wherein each of the unit PCBs is a single layer PCB or a multilayer (build-up) PCB.

4. The PCB of claim 1, wherein a width of each of the first sawing line and the second sawing line is less than 300 μm.

5. The PCB of claim 2, wherein each groove is connected with the first sawing line and the second sawing line.

6. The PCB of claim 2, wherein each groove is a V-shaped groove.

* * * * *